United States Patent [19]

Chesworth

[11] Patent Number: 4,469,045
[45] Date of Patent: Sep. 4, 1984

[54] COATING GLASS

[75] Inventor: Peter Chesworth, Longton, England

[73] Assignee: Pilkington Brothers P.L.C., St. Helens, England

[21] Appl. No.: 493,657

[22] Filed: May 16, 1983

Related U.S. Application Data

[60] Continuation of Ser. No. 223,714, Jan. 9, 1981, abandoned, which is a division of Ser. No. 094,988, Nov. 16, 1979, abandoned, which is a continuation of Ser. No. 931,002, Aug. 4, 1978, abandoned, which is a continuation of Ser. No. 693,504, Jun. 7, 1976, abandoned.

[30] Foreign Application Priority Data

Jun. 11, 1975 [GB] United Kingdom ............... 25077/75

[51] Int. Cl.³ .............................................. B05C 1/04
[52] U.S. Cl. .................................. 118/718; 427/255; 427/255.5; 65/60.4; 65/60.5
[58] Field of Search ............................ 427/255, 255.5; 118/718; 65/60.4, 60.5, 60.51, 60.52

[56] References Cited

U.S. PATENT DOCUMENTS

| 2,332,309 | 10/1943 | Drummond | 118/718 |
| 3,190,262 | 6/1965 | Bakish et al. | 118/718 |
| 3,672,948 | 6/1972 | Foehring et al. | 427/255.5 |
| 3,674,453 | 7/1972 | Loukes et al. | 65/60.51 |
| 4,019,887 | 4/1977 | Kirkbride et al. | 118/718 X |

Primary Examiner—Shrive P. Beck
Attorney, Agent, or Firm—Burns, Doane, Swecker & Mathis

[57] ABSTRACT

A surface of a hot ribbon of glass, which has just been formed, is coated by directing a flow of coating gas substantially parallel to the glass surface under laminar flow conditions. The laminar flow is in the direction of ribbon advance or co-current to that direction, and the gas is released uniformly across the width of the ribbon. The coating gas contains a constituent, for example a silane, which decomposes on the hot glass surface to deposit a coating, for example silicon, on the glass surface.

10 Claims, 6 Drawing Figures

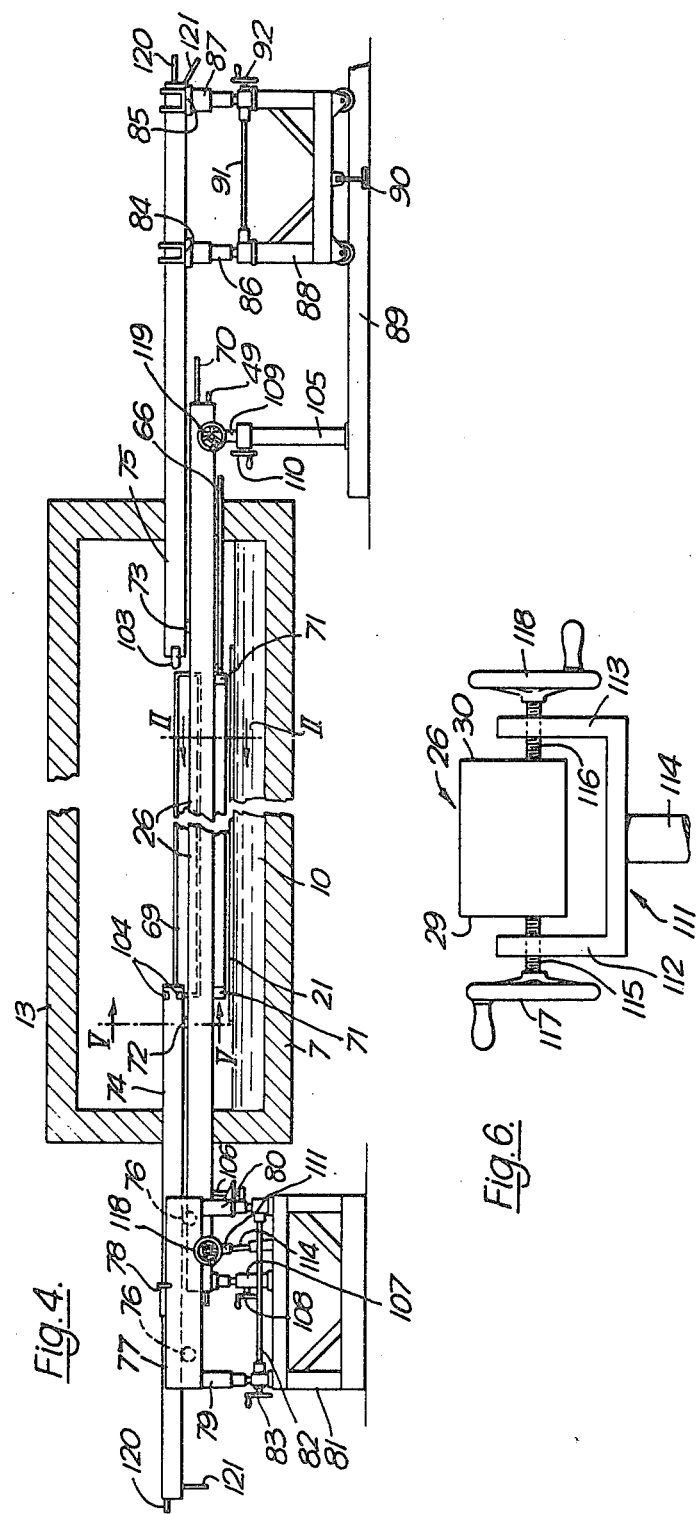

COATING GLASS

This application is a continuation of application Ser. No. 223,714, filed Jan. 9, 1981, now abandoned, which is a division of application Ser. No. 094,988, filed Nov. 16, 1979, now abandoned, which is a continuation application of Ser. No. 931,002 (now abandoned) filed Aug. 4, 1978, which is a continuation of application Ser. No. 693,504 (now abandoned) filed June 7, 1976.

BACKGROUND OF THE INVENTION

This invention relates to a method and apparatus for coating glass.

It has previously been proposed to coat flat glass by contacting the glass with a gaseous coating material at substantially atmospheric pressure. However, it has been difficult to achieve uniform coatings on a moving glass ribbon by known techniques. In U.S. Pat. No. 3,850,679, it is proposed to enhance the uniformity of films produced by chemical vapour deposition by directing coating gas onto the glass surface through a nozzle at a Reynolds number of at least 2,500. For high speed coating a continuous ribbon or sheet of glass, a Reynolds number of at least 5,000 for the flowing gas is recommended. The use of a Reynolds number above 2,500 means that the gas flow is turbulent.

In contrast, it has now been found that uniform coatings may be formed by causing a coating gas to flow substantially parallel to the surface of a moving ribbon of glass to be coated under laminar flow conditions as opposed to turbulent flow conditions.

SUMMARY

The present invention provides a method of coating flat glass, in which a coating gas is directed onto a surface to be coated of a moving ribbon of glass from a distributor extending across that surface and across the direction of movement of the ribbon. The glass flows substantially parallel to the glass surface under laminar flow conditions and uniformly across the width of that surface.

The method of the invention is especially, but not only, useful for coating the glass still hot from the forming process, for example a ribbon of float glass.

The coating gas may be a gas comprising a gaseous material which condenses on the glass surface, for example, a metal vapour.

The invention is especially useful for applying a coating from a coating gas which reacts on contacting the hot glass surface to deposit a coating material on the glass.

Examples of such gases are volatile metal carbonyls, or hydrides which decompose on contacting hot glass, for example silanes, especially monosilane, which pyrolyse to deposit a silicon coating on the glass as described in Patent Application The coating gas may be a mixture, for example a mixture containing one or more of the above compounds, or a mixture containing a compound, for example a metal halide, and a compound or element which reacts with it, for example oxygen or an oxygen-containing compound, to deposit a coating material. If desired, the coating gas may contain a non-reactive component, for example nitrogen, which serves as a carrier.

The temperature of the coating gas is preferably regulated to prevent any substantial formation of the solid coating material before the gas reaches the glass surface. Thus the temperature in gas supply channels in a distributor for the gas is preferably kept sufficiently high to prevent condensation of the coating gas, but sufficiently low to prevent any substantial decomposition of the coating gas before the coating gas reaches the glass surface.

The coating gas is conveniently supplied to the glass at substantially atmospheric pressure. Higher or lower pressures may be used provided any necessary precautions are taken to prevent pressure differentials interfering with the laminar flow of the gas parallel to the glass surface, or leading to undesirable escape of gas from the coating station.

The coating gas is preferably directed parallel to the glass over the glass surface at substantially uniform pressure across the width of the glass to be coated. This promotes laminar flow conditions and assists achievement of a uniform coating. In order to obtain a uniform coating, it is desirable that the ribbon of glass receives exactly the same treatment across the full width of the ribbon to be coated. It is therefore desirable that the direction of flow of the coating gas parallel to the plane of the ribbon should be substantially parallel to the direction of movement of the ribbon. Whilst co-current or counter-current flow may be used, it has been found that laminar flow conditions are most easily maintained when the coating gas is directed co-current with the direction of movement of the glass relative to the distributor for the gas.

The invention also provides apparatus for coating flat glass, comprising a support for the glass to be coated, a gas distributor extending across the width of glass surface to be coated, and means for effecting relative movement between the glass and the distributor, the gas distributor including a gas supply duct, and a guide channel extending across the width of the glass to be coated, said guide channel being defined by shaped walls arranged to guide the gas supplied from the gas supply duct and cause the gas to flow substantially parallel to the glass surface to be coated under laminar flow conditions.

To provide uniform distribution of gas across the width of the glass to be coated, a gas flow restrictor may be provided between the gas supply duct and the guide channel.

The gas flow restrictor is conveniently constituted by an array of channels of small cross-sectional area between the supply duct and the guide channel, the dimensions of which channels being such that the pressure drop along the duct is small compared to the pressure drop along the channels.

The apparatus may further include means for controlling the temperature of the wall defining the path of the gas substantially parallel to the glass surface. The temperature controlling means may comprise thermal insulation between the supply duct and said wall.

Further according to the invention shaped walls may be provided to guide gas away from the glass surface after deposition of coating material on the glass surface.

The apparatus may also include blower means to disperse the gas guided away from the glass surface. An extractor may also be provided at an appropriate location.

In a preferred embodiment of the apparatus, the gas distributor comprises a centre block and first and second side members disposed adjacent said centre block defining a substantially U-shaped guide channel for the gas from the gas flow restrictor means between the first side member and the upstream side wall of the centre block, between the bottom wall of the centre block and the path of the glass and between the second side member and the downstream side wall of the centre block.

Preferably the first and second side members terminate just short of the path of the glass and their bottom walls extend substantially parallel to the glass surface to minimise escape of gas between the glass and bottom walls of the side members.

This invention also comprehends coated glass produced by a method according to the invention.

BRIEF DESCRIPTION OF THE DRAWINGS

An embodiment of the invention will now be described, by way of example, with reference to the drawings in which:

FIG. 4 is a section on the line IV—IV of FIG. 1, FIG. 6 illustrates a detail of the apparatus used for positioning and supporting the gas distributor over the path of travel of the ribbon of glass.

In the drawings the same references indicate the same or similar parts.

The drawings illustrate a preferred form of apparatus according to the invention for use in applying a uniform coating to the upper surface of a ribbon of float glass. In the embodiment shown, the coating is applied towards the outlet end of the bath as the ribbon approaches the location where it is lifted from the surface of a bath of molten metal on which the ribbon has been formed.

Figure 1:
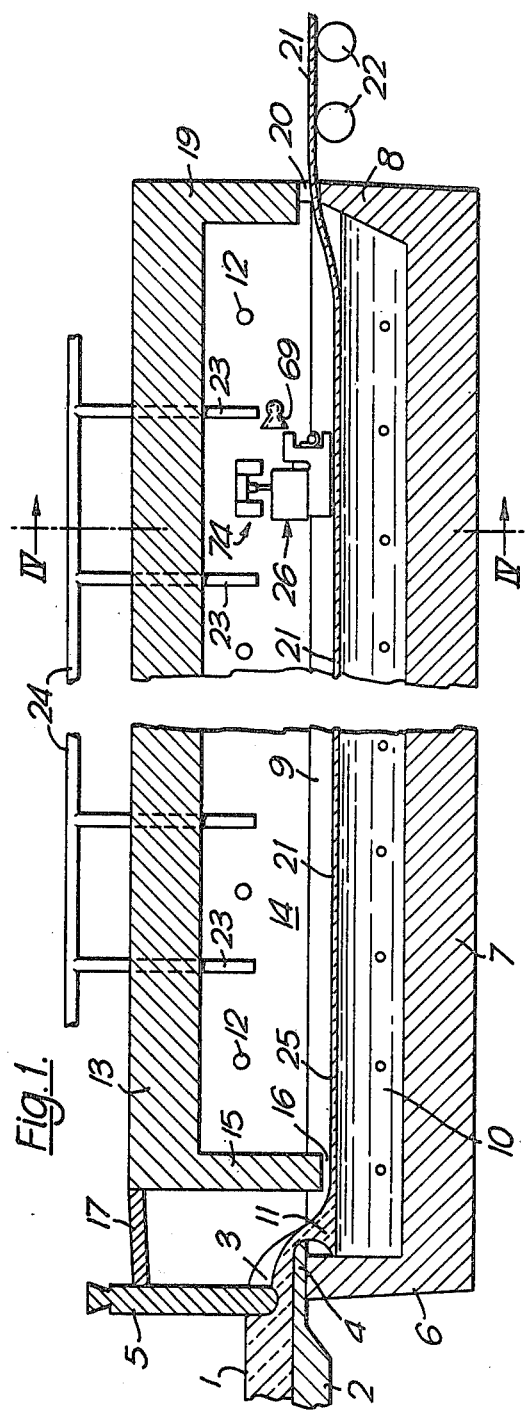
FIG. 1 is a vertical section through float glass manufacturing apparatus showing a tank structure containing a molten metal bath and a gas distributor according to the invention extending transversely to the path of travel of the ribbon of glass near the outlet end of the apparatus.

FIG. 1 illustrates molten glass 1 being delivered in conventional manner along a canal 2 leading from the forehearth of a glass melting furnace. The canal 2 terminates in a spout having side jambs 3 and a lip 4 and flow of molten glass to the spout, usually soda-line-silica glass, is controlled by a regulating tweel 5. The spout extends over the inlet end wall 6 of a tank structure comprising a floor 7, an outlet end wall 8 and side walls 9.

The tank structure contains the bath of molten metal 10, usually molten tin or tin alloy in which tin predominates, and molten glass flows as indicated at 11 over the spout lip 4 into the surface of the molten metal bath 10 at the inlet end of the bath where the temperature is maintained in the region of 1,000° C. by heaters, indicated at 12, mounted in a roof structure 13 which is supported over the tank structure and defines a head space 14 above the molten metal bath. The roof structure has an inlet end wall 15 which depends downwardly close to the surface of the molten metal bath 10 at the inlet end of the bath to provide an inlet 76 of restricted height. An extension 17 of the roof structure extends up to the tweel 5 to provide a chamber in which the spout is enclosed.

The roof structure also has a downwardly depending wall 19 at the outlet end. An outlet 20 for a ribbon of glass 21 produced on the bath is defined between the lower face of the outlet end wall 19 of the roof structure and the upper face of the outlet end wall 8 of the bath. Driven traction rollers 22 are mounted beyond the outlet 20 with the upper surfaces of the rollers just above the level of the upper surface of the bath end wall 8 so that the ribbon of glass is lifted gently from the bath surface for discharge horizontally away from the outlet 20 from the bath on the rollers 22.

A protective atmosphere, for example 95% nitrogen and 5% hydrogen, is maintained at a plenum in the headspace 14 over the bath, being supplied through ducts 23 extending downwardly through the roof 13 and connected to a common header 24. Protective atmosphere flows outwardly through the inlet 16 to fill the chamber 17 enclosing the spout.

A temperature gradient is maintained down the bath from a temperature of about 1,000° C. at the inlet end of the bath to a temperature in the range about 570° C. to 650° C. at the outlet end where the ribbon of glass is discharged from the bath. At this lower temperature the glass is sufficiently stiffened to be unharmed by its contact with the traction rollers 22 but can still be lifted from the bath surface as illustrated.

The molten glass 11 which flows over the spout lip 4 onto the bath is permitted to flow laterally on the bath to form a layer 25 of molten glass which is then advanced as a ribbon 21 which is cooled and discharged from the bath. The width of the tank structure containing the bath between the side walls 9 is greater than the width of the ribbon.

A gas distributor 26 for supplying coating gas to the surface of the glass ribbon is located transversely of the path of travel of the ribbon of glass along the bath near the outlet end of the bath as illustrated in FIG. 1. The distributor thus extends across the upper surface of the ribbon of glass and across the direction of movement of the ribbon. The gas distributor 26 is illustrated in greater detail in FIGS. 2 to 4 and has an open-faced chamber 27 shaped for laminar flow of the coating gas parallel to the glass surface.

Figure 2:
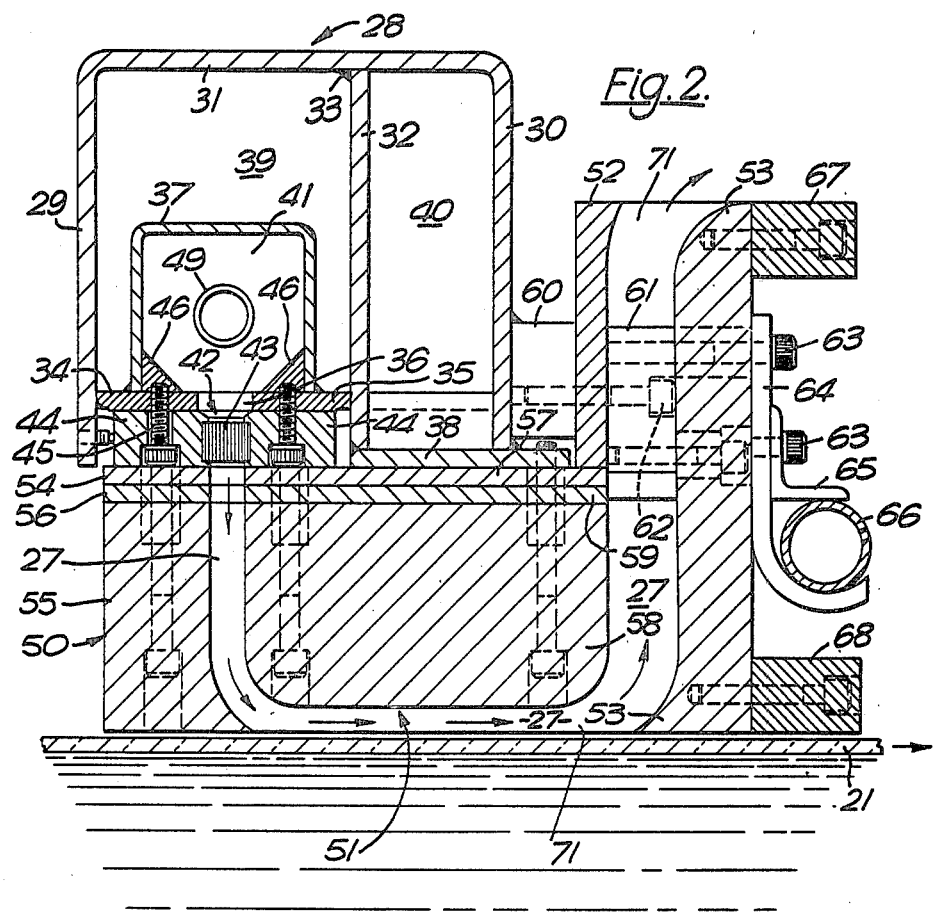
FIG. 2 is a vertical section through the gas distributor on line II—II of FIG. 4, showing the distributor in greater detail.

As illustrated in FIG. 2, the gas distributor 26 comprises an inverted U-section channel member 28 having side walls 29 and 30 and a top wall 31. The channel within member 28 is divided by a vertical partition 32 welded at 33 to the top wall 31. Horizontal members 34 and 35 respectively extend inwardly from the side wall 29 and the partition 32 adjacent their lower edges and together define an elongated aperture 36. A second smaller U-section channel member 37 is inverted symmetrically between side wall 29 and partition 32, its lower edges being welded to the horizontal members 34 and 35. A horizontal member 38 is welded to the base of the vertical partition 32 and the base of the wall 30, and extends beyond the wall 30.

The two inverted U-section channel members 28 and 37, together with horizontal members 34 and 35, define a U-section duct 39 for the passage of a heat transfer fluid; a rectangular return duct 40 is defined by the side wall 30, the top wall 31, the partition 32 and the horizontal member 38. The interior face of U-section channel member 37, together with horizontal members 34 and 35, defines a gas supply duct 41.

Gas flow restrictor means 42 comprising a waffle plate 43 mounted between support plates 44 is bolted to the underside of horizontal members 34 and 35 by countersunk bolts which are screwed into filling blocks 46 which extend along the bottom corners of the gas supply duct 41 on either side of the aperture 36. The waffle plate 43 is thus aligned with the aperture 36.

Figure 3:
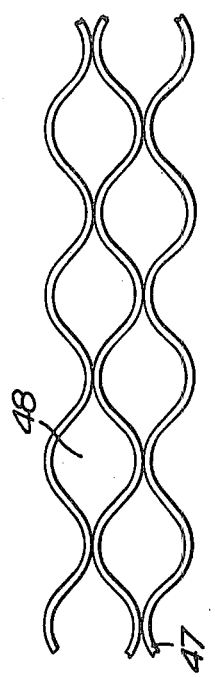
FIG. 3 is an enlargement of part of gas flow restrictor means shown in FIG. 2.

The central waffle plate 43 comprises, as illustrated in detail in FIG. 3, a plurality of similar crimped metal strips 47 arranged "out-of-phase" to define a plurality of channels 48 which are of small cross-sectional area relative to the cross-sectional area of the gas supply duct 41 so that when coating gas is supplied under pressure to the duct 41 through gas supply ducts 49 at either end of the distributor, as illustrated in FIG. 4, the pressure drop along the duct 41 is small compared with the pressure drop through the restricted channels 48 and the waffle plate 43 effectively constitutes gas-flow restrictor means to ensure release of coating gas at a substantially constant pressure and temperature along the whole of its length, and hence uniformly across the width of glass to be coated.

Shaped carbon blocks 50, 51, 52 and 53 define the U-shaped chamber 27 having an open face extending across the ribbon of glass 21 to be coated. The carbon block 50 comprises upper and lower sections 54 and 55 with a layer 56 of fibrous thermal insulation bonded between them. Shaped carbon block 51 similarly comprises a laminate of upper and lower sections 57 and 58 with a layer of fibrous thermal insulation 59 bonded between them. The thermal insulation layers 56 and 59 control the flow of heat between the gas supply duct 41 and the chamber 27.

A plurality of spaced distance pieces 60 are welded to the outer face of side wall 30 of the U-section channel member 28. The shaped carbon block 52 stands on the top face of carbon block 57 in contact with the rear faces of distance pieces 60. Spaced distance pieces 61, corresponding to distance pieces 60, are disposed in the downstream limb of the U-shaped chamber 27 and separate shaped carbon blocks 52 and 53. The distance pieces 61 and the carbon block 52 are secured to the distance pieces 60 by bolts 62 whose heads are countersunk in the distance pieces 61. The shaped carbon block 53 is secured by bolts 63 which are secured in the distance pieces 61. The bolts 63 also secure brackets 64 and 65 which extend along the distributor and support a duct 66 having an elongated aperture forming a nozzle for the supply of gas under pressure.

The faces of the carbon blocks 50, 51, 52 and 53 which define the walls of the U-shaped chamber 27 are smooth and shaped to avoid turbulence and allow laminar flow of gas over the glass surface. Subsidiary carbon blocks 67 and 68 are secured to the back face of shaped carbon block 53 at the top and bottom thereof to assist in controlling the gas flow. The lower subsidiary block 68 extends horizontally close to the gas surface and restricts the flow of gas under the foot of block 53.

The upper subsidiary block 67 extends horizontally from the top of the chimney formed between carbon blocks 52 and 53 and directs coating gas exiting from the chimney so that it does not immediately descend on to the glass ribbon. An extractor is provided having an extraction duct 69, FIG. 1, extending along the length of the distributor adjacent the outlet of the chimney formed by the carbon blocks 52 and 53 to extract surplus coating gas from above the glass ribbon. The extraction duct 69 is arranged so that extraction of coating gas does not disturb the laminar flow of coating gas over the glass ribbon.

A heat transfer fluid, for example cooling water, is supplied to one end of the gas distributor, outside the tank structure, as illustrated in FIG. 4. A fluid supply pipe 70 is connected to the duct 39 and fluid flows along the duct 39 to the other end of the distributor and then through a hole, not shown, in the partition 32 into the return duct 40 in the member 28. The fluid flows along the return duct 40 to a discharge pipe, not shown, at the same end of the distributor as the fluid supply pipe 70. The supply of heat transfer fluid in this way controls the temperature of the gas supply duct 41 and hence the temperature of coating gas in the duct.

FIG. 4 shows how the shaped carbon blocks 50, 51, 52 and 53 extend only in a central part of the distributor over the width of glass ribbon to be coated. The elongated aperture 36 therefore extends only over a central part of the gas supply duct 41 and towards both ends of the duct, that is beyond the shaped carbon blocks the gas supply duct 41 and the cooling water duct 39 have a continuous floor constituted by a continuous plate which is welded to the walls 29 and 32. L-shaped carbon end blocks 71 are provided at each end of the carbon blocks 50, 51, 52 and 53 to prevent lateral escape of coating gas from the gas passages defined by carbon blocks 50, 51, 52 and 53. The end blocks 71 are sufficiently thick substantially to prevent escape of the coating gas under them.

The gas distributor 26 is adjustably suspended at two fixed points 72 and 73 from support beams 74 and 75 as illustrated in FIG. 4. The left hand support beam 74 is mounted on rollers 76 indicated in dotted outline, in frame 77 and is locked in position relative to frame 77 by track lock 78. The frame 77 is rectangular in plan and is supported at its corners by four jacks. The two jacks 79 and 80 supporting the frame 77 on one side thereof are shown. A corresponding pair of jacks are disposed directly opposite jacks 79 and 80 on the other side of the frame 77. The jacks are mounted on a support cradle 81 and jacks 79 and 80 are coupled by a drive rod 82 and are adjustable by a handwheel 83. The corresponding jacks are similarly adjustable.

The right hand support beam 75 is mounted on support members 84 and 85 which extend transversely under it. The support member 84 is mounted at its ends on jack 86 and a corresponding jack, not shown, on the other side of support beam 75. Similarly, support member 85 is carried at its ends on a jack 87 and a corresponding jack, not shown, on the other side of support beam 75. The jacks 86 and 87 and their corresponding jacks are mounted on a trolley 88 arranged to run on a track 89. The trolley is shown locked in position by the track lock 90. The jacks 86 and 87 are coupled by a drive rod 91 and are adjustable by handwheel 92. The corresponding jacks are similarly adjustable.

Figure 5:
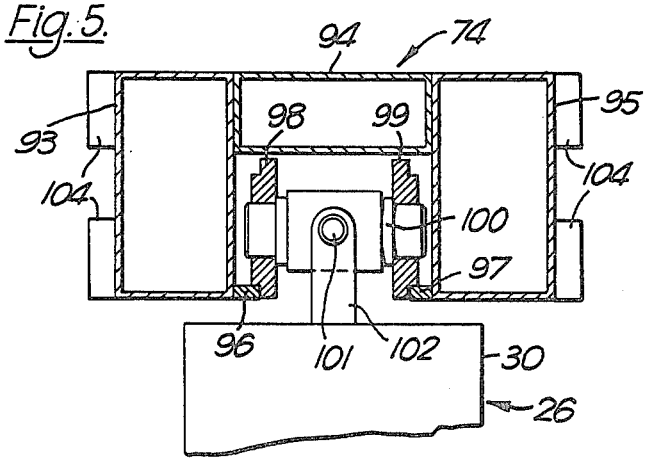
FIG. 5 is a view partly in section on line V—V of FIG. 4.

FIG. 5 is a cross-section through the support beam 74 at the fixed point 72 and illustrates the mode of suspension of the gas distributor 26 from the support beams 74 and 75. The support beam 74 is made up of three rectangular channel sections 93, 94 and 95 disposed to form an inverted U, the sections 93 and 95 forming the limbs of the U. Tracks 96 and 97 are provided on the inner edges of the channel sections 93 and 95 and flanged wheels 98 and 99 run along the tracks 96 and 97 respectively within the U. The flanged wheels 98 and 99 are rotatably mounted on an axle 100 which comprises a frame carrying a horizontal pivot 101 perpendicular to axle 100. A suspension member 102 for the gas distributor 26 is rotatably mounted on the pivot 101 and is welded to the top of gas distributor 26.

The wheels 98 and 99 are a close fit within the inverted U formed by the channel sections 93, 94 and 95 so that, apart from being free to rotate, they are substantially fixed in position on the tracks, and pivot 101 is therefore substantially fixed in position at fixed point 72. The gas distributor is similarly suspended from support beam 75 at the fixed point 73.

To set up the gas distributor over the glass ribbon 21, the support beams 74 and 75 are run into the tank structure from opposite sides so that lugs 103 on the support beam 75, FIG. 4, engage between projecting pads 104 on the support beam 74. The support beam 74 slides over the rollers 76, whilst the support beam 75 is moved by advancing the trolley 88 along the track 89 with a column 105 temporarily removed. The gas distributor 26 is then fed across the supporting beams 74 and 75 with the wheels 98 and 99 and corresponding wheels which are eventually located at the fixed point 73, engaging the tracks on the underside of the support beams. When the gas distributor is in position, it is locked in position by a locking screw 106 mounted on the support cradle 81, and the support beams 74 and 75 are then withdrawn to the positions shown in FIG. 4 and locked in position by the track locks 78 and 90.

The position of the gas distributor within the tank structure may be adjusted by flexing the distributor about the fixed points 72 and 73. The left hand end of the gas distributor, as shown in FIG. 4, is connected to a jack 107 operated by a hand wheel 108 and mounted on the support cradle 81. Similarly, the right hand side of the gas distributor 26 is connected to a jack 109 operated by a hand wheel 110 and mounted on the column 105. The column 105 is bolted to the track 89 between the trolley 88 and the tank structure.

Since the distributor is effectively locked in position at the fixed points 72 and 73, the jacks 107 and 109 can be used to correct vertical bowing of the gas distributor 26. For example, sag towards the centre of the gas distributor can be corrected by lowering the jacks 107 and 109 whilst maintaining the fixed points 72 and 73.

The apparatus also includes means for countering any tendency of the gas distributor to twist over the glass ribbon. A U-shaped bracket 111, FIGS. 4 and 6, having limbs 112 and 113 is mounted by a support 114 on the cradle 79. The limbs 112 and 113 of the bracket are disposed on either side of the gas distributor 26. Screw-threaded rods 115 and 116 engage in screw-threaded holes in the limbs 112 and 113 and bear on the side walls 29 and 30 of the gas distributor near to the bottom of the walls. Handwheels 117 and 118 are mounted on the screw-threaded rods 115 and 116 and provide for adjustment of the rods. An U-shaped bracket 119, similar to the bracket 111, is mounted on the column 105 on the right hand side of the gas distributor as shown in FIG. 4. Like bracket 111, it is provided with screw-threaded rods, adjustable by handwheels, the rods bearing on the side walls of the gas distributor near to the bottom of the walls. By adjusting the screw-threaded rods in the brackets 111 and 119, whilst maintaining the fixed points 72 and 73, any tendency of the gas distributor to twist over the glass ribbon may be countered.

Adjustment of the screw-threaded rods 115 and 116 also assists in lining up the gas distributor 26 with its lower face parallel to the glass ribbon, that is, adjusting its position in relation to the fixed points 72 and 73 about which it pivots.

The fluid circulation system comprising ducts 39 and 40 is preferably connected to heat transfer fluid supply and discharge pipes before the gas distributor has been positioned over the glass. When the gas distributor is in position, the gas supply ducts 49 are connected to a source of coating gas, and the duct 66 is connected to a source of gas.

The support beams 74 and 75 are cooled by a cooling fluid, for example water, passed through the rectangular ducts within the beams through fluid supply and discharge pipes 120 and 121. Cooling of the beams alleviate distortion under the high temperature conditions which exist in the float bath and assist in maintaining the gas distributor level over the glass ribbon.

When the gas distributor is across the glass ribbon, its height over the ribbon may be adjusted by means of the jacks mounted on the cradle 81 and the trolley 88 which operate to raise and lower the support beams 74 and 75. The gas distributor is positioned so that the upstream and downstream carbon blocks 50 and 53 and the end blocks 71 are just clear of the surface of the glass ribbon. In this way, escape of coating gas underneath the carbon blocks is minimized. The dimensions of carbon block 51 are chosen so that, when blocks 51 and 53 are just clear of the glass, the portion of chamber 27 between block 51 and the glass ribbon is so dimensioned that the coating gas flows through the chamber over the glass under laminar flow conditions, that is, at a Reynold's number below 2,500. In practice the Reynold's number is generally below 1,000, and preferably below 100. The gas flow is a co-current with the direction of movement of the glass relative to the distributor as indicated by arrows in FIG. 2.

The apparatus shown in the drawings is especially suitable for the deposition of coatings containing silicon from monosilane gas, $SiH_4$. Since silane decomposes significantly above 400° C., water is used in the ducts 39 and 40 to cool the gas distributor and inhibit premature decomposition of the silane gas. Similarly, water is passed through the ducts of the support beams to prevent the beams distorting under the hot conditions of operation. The layers of insulation 56 and 59 in carbon blocks 50 and 51 restrict the flow of heat from the lower sections 55 and 58 of the blocks into the water cooled part of the gas distributor and allow the lower sections 55 and 58 to be heated by heat radiated from the glass ribbon. Thus silane coating gas passed into the chamber 27 is steadily warmed up as it flows between the carbon blocks 50 and 51. This steady heating assists in preserving laminar flow conditions.

The edges of the blocks are shaped so that the gas flow is turned parallel to the glass whilst maintaining laminar flow conditions. As the silane coating gas flows between the carbon block 51 and the glass ribbon, silicon deposits uniformly on the glass across the width of the glass ribbon. To promote laminar flow conditions it is desirable that there should not be substantial temperature gradients across the gas flow. Also the walls should not be so hot that there is unacceptable deposition of silicon on those walls. The thermal insulation 59 serves as means for controlling the temperature of the wall defining the path of the coating gas substantially parallel to the glass surface.

The carbon blocks 51 and 53 are shaped so that the gas which has flowed over the ribbon is diverted upwardly whilst maintaining laminar flow conditions. The gas passage between carbon blocks 51 and 53 has a larger cross section than the passage between blocks 50 and 51 to allow for expansion of the coating gas that has occurred as the gas has been heated. The exact relative dimensions of the passages desirable to achieve laminar flow conditions depends upon the conditions of operation and the composition and nature of the coating gas used.

A flow of gas from the nozzle of duct 66 disperses coating gas exiting between carbon blocks 52 and 53.

The apparatus shown in the drawings was set up as described above and used for the application of silicon coatings under the following conditions.

| | |
|---|---|
| Composition of protective atmosphere | 90% by volume nitrogen |
| | 10% by volume hydrogen |
| Lehr speed of ribbon | 365 meters/hour |
| Glass temperature | 620° C. |

The coating gas was silane diluted with nitrogen. The rate of supply of the coating gas was adjusted to provide laminar flow conditions over the glass surface so that a substantially uniform coating was achieved. The rate of supply of the coating gas was then 50 liters/minute/meter of operative distributor length. The composition of the coating gas was varied, whilst maintaining the total gas flow rate constant, to form silicon coatings of different thicknesses. Using gas mixtures of composition:

(a) 50% by volume monosilane, $SiH_4$ 95% by volume nitrogen (b) 10% by volume monosilane, $SiH_4$ 90% by volume nitrogen (c) 7% by volume monosilane, $SiH_4$ 3% by volume hydrogen 90% by volume nitrogen glass having substantially uniform silicon coatings was produced. The thickness and refractive index of the coatings and the optical properties of the coated glass were:

| | (a) | (b) | (c) |
|---|---|---|---|
| Wavelength of maximum reflection ($\lambda$ max) | 4800Å | 7100Å | 6000Å |
| Refractive index of coating | 3.45 | 4.00 | 3.80 |
| Optical thickness of coating | 1190Å | 1780Å | 1500Å |
| Thickness of coating (Optical thickness/refractive index) | 348Å | 444Å | 395Å |
| White light transmission | 25% | 21% | 18% |
| Direct solar heat transmission | 37% | 24% | 25% |
| Solar radiant reflection | 43% | 54% | 52% |
| Colour in transmission | brown | green | brown |
| Colour in reflection | silver | gold | silver/gold |

The process and apparatus of the invention has been specifically described for the application of a silicon coating to a ribbon of glass on a molten metal bath. However, the principle of the invention may be used for the application of other coatings as described above from the vapour phase to a ribbon of glass.

To this end other gases which decompose on contacting hot glass may be employed in carrying out the invention, including the volatile metal carbonyls, for example the carbonyls of iron, chromium, tungsten, nickel and cobalt; and volatile organometallic compounds, especially metal acetylacetonates, for example the acetylacetonates of copper, iron and cobalt. When using these gases the temperature in the gas supply channels in the distributor 26 is preferably kept sufficiently high to prevent condensation of the coating gas on those channels, but sufficiently low to prevent any substantial decomposition of the coating gas before it reaches the hot glass surface. If required the gas supply duct 41 may be heated by circulating a hot liquid, for example a hot oil, through the ducts 39 and 40.

Moreover it will of course be appreciated that in addition to monosilane, other silanes which decompose on hot glass may be used to deposit a silicon coating; for example, higher silanes may be used such as disilane, or substituted silanes such as chlorosilanes which are generally used in the presence of hydrogen.

As well as the coating of float glass described above, the invention may be employed for the coating of sheet glass produced by a vertical drawing process or for the coating of rolled plate glass. The coating may take place before the formed ribbon of glass enters the annealing lehr, or at a location in the annealing lehr where the glass is still sufficiently hot to promote the required decomposition of the coating gas on a surface of the glass.

I claim:

1. Apparatus for coating a surface of moving flat glass by deposition of a coating material on the glass surface, said apparatus comprising:
   a support for the glass to be coated; gas distributor means, positionable across the width of the glass surface to be coated, and including
   a gas supply duct arranged to supply a flow of coating gas at a substantially uniform pressure across the width of the glass surface to be coated, and
   guide channel means extending for location across the width of the glass surface to be coated, and operable to define with the relatively moving glass surface a chamber which extends parallel to the glass surface; and
   means for effecting said relative movement between the glass and the distributor means along a straight path through said chamber;
   said guide channel means being defined by smooth shaped walls arranged to guide said gas flow from the gas supply duct towards said chamber, to turn said gas flow into said chamber and direct said gas flow through said chamber parallel to the relatively moving glass surface and parallel to the direction of relative movement of that surface; said guide channel means including a smooth, curved section to effect the turn of said gas flow.

2. Apparatus according to claim 1, including means for extracting surplus coating gas from above the glass ribbon.

3. Apparatus according to claim 1, wherein said means for effecting relative movement is operable to move the glass in a direction co-current with said gas flow through said chamber.

4. Apparatus according to claim 1, wherein gas flow restrictor means is provided between said gas supply duct and said guide channel means to provide a uniform distribution of gas at said substantially uniform pressure across the width of the glass surface to be coated.

5. Apparatus for coating a surface of moving flat glass by deposition of a coating material on the glass surface, said apparatus comprising:
   a support for the glass to be coated;
   gas distributor means positionable across the width of the glass surface to be coated; and
   means for effecting relative movement between the glass and said gas distributor means;
   said gas distributor means comprising a gas supply duct arranged to supply a flow of coating gas at a substantially uniform pressure across the width of the glass surface to be coated, a centre block, and a side member disposed adjacent said centre block; which centre block and side member have smooth-shaped walls which define a shaped guide channel for directing said gas flow downwardly from said gas supply duct between said side member and a side wall of said centre block and turning said gas flow through a chamber defined between the bottom wall of said centre block and said relatively moving glass surface, which chamber extends parallel to the glass surface across the width of the glass surface to be coated, said gas flow being thereby directed through said chamber parallel to the relatively moving glass surface and parallel to the direction of relative movement of that surface; said shaped guide channel including a smooth, curved section to effect the turning of said gas flow.

6. Apparatus for coating a surface of moving flat glass by deposition of a coating material on the glass surface, said apparatus comprising:

a support for the glass to be coated;

gas distributor means, positionable across the width of the glass surface to be coated, and including a gas supply duct arranged to supply a flow of coating gas at a substantially uniform pressure across the width of the glass surface to be coated, and guide channel means extending for location across the width of the glass surface to be coated, and operable to define with the relatively moving glass surface a chamber which extends parallel to the glass surface; and means for effecting said relative movement between the glass and the distributors means along a straight path through said chamber;

said guide channel means being defined by smooth-shaped walls arranged to guide said gas flow from the gas supply duct towards said chamber, to turn said gas flow into said chamber and direct said gas flow through said chamber parallel to the relatively moving glass surface and parallel to the direction of relative movement of that surface and to divert said gas flow upwardly from that chamber;

said guide channel means including a smooth, curved section to effect the turn of said gas flow.

7. Apparatus for coating a surface of moving flat glass by deposition of a coating material on the glass surface, said apparatus comprising:

a support for the glass to be coated;

gas distributor means positionable across the width of the glass surface to be coated; and means for effecting relative movement between the glass and said gas distributor means;

said gas distributor means comprising a gass supply duct arranged to supply a flow of coating gas at a substantially uniform pressure across the width of the glass surface to be coated, a centre block, and first and second side members disposed adjacent said centre block; which centre block and first and second side members have walls which are smooth and shaped to define a substantially U-shaped guide channel for directing the gas flow downwardly from said gas supply duct between said first side member and a side wall of said centre block, turning said gas flow through a chamber defined between the bottom wall of said centre block and said relatively moving glass surface, said gas flow being thereby directed through said chamber parallel to the relatively moving glass surface and parallel to the direction of relative movement of that surface, and diverting said gas flow upwardly from said chamber between said second side member and another side wall of said centre block; said shaped guide channel including a smooth, curved section to effect the turning of said gas flow.

8. Apparatus according to claim 7, including means for extracting surplus coating gas directed upwardly away from said gas distributor means.

9. Apparatus according to claim 7, wherein said means for effecting relative movement is operable to move the glass in a direction co-current with said gas flow through said chamber.

10. Apparatus according to claim 7, wherein gas flow restrictor means is provided between said gas supply duct and said guide channel to provide said flow of coating gas at a substantially uniform pressure across the width of the glass surface to be coated.

* * * * *